United States Patent [19]

Morimoto

[11] Patent Number: 5,519,207
[45] Date of Patent: May 21, 1996

[54] SOLID-STATE IMAGE PICKUP DEVICE HAVING DIFFERENT STRUCTURES FOR IMAGE SENSING REGION AND OPTICAL BLACK REGION

[75] Inventor: Michihiro Morimoto, Tokyo, Japan

[73] Assignee: NEC Corporation, Tokyo, Japan

[21] Appl. No.: 363,886

[22] Filed: Dec. 27, 1994

[30] Foreign Application Priority Data

Dec. 28, 1993 [JP] Japan ................................ 5-337165

[51] Int. Cl.$^6$ .................................................. H01J 40/14
[52] U.S. Cl. ...................... 250/208.1; 257/232; 257/233
[58] Field of Search ...................... 250/208.1; 257/249, 257/250, 232, 233; 358/483; 348/245

[56] References Cited

U.S. PATENT DOCUMENTS 5,083,171  1/1992  Komatsu et al. .
5,151,385  9/1992  Yamamoto et al. .

FOREIGN PATENT DOCUMENTS 62-145771  6/1987  Japan .
63-266868  11/1988  Japan .

OTHER PUBLICATIONS

"New Shunt Wiring Technologies for High Performance HDTV CCD Image Sensors," K. Orihara et al., Technical Digest of the IEDM, 1992, pp. 105–108.

Primary Examiner—Georgia Y. Epps
Assistant Examiner—Jacqueline M. Skeady
Attorney, Agent, or Firm—Popham, Haik, Schnobrich & Kaufman, Ltd.

[57] ABSTRACT

In a solid-state image sensing device in which metallic wirings for supplying drive pulses to every transfer electrodes of vertical CCD registers are provided on the vertical CCD registers, the spacings between the metallic wirings are given mutually different sizes for an effective image sensing region and an optical black region. The shape of the step part beneath a light shielding film in the optical black region is improved, and the transmission of light is prevented. Accordingly, a correct black reference level can be obtained.

7 Claims, 3 Drawing Sheets

SOLID-STATE IMAGE PICKUP DEVICE HAVING DIFFERENT STRUCTURES FOR IMAGE SENSING REGION AND OPTICAL BLACK REGION

BACKGROUND OF THE INVENTION

The present invention relates to a two-dimensional CCD type solid-state image pickup device, and more particularly to the constitution of metallic wirings formed in the region above the vertical CCD registers for supplying a transfer pulse to the transfer electrodes.

FIG. 4 is a block diagram of a general interline CCD type solid-state image pickup device. The interline CCD type solid-state image pickup device comprises a plurality of photodiodes 101, a plurality of vertical CCD registers 102 which receive electric charges from the photodiodes and transfer them, a horizontal CCD register 103 which receives electric charges from the vertical CCD registers 102 and transfers them, a charge detection part 104 which detects the electric charges transferred by the horizontal CCD register 103, and an output amplifier 105. An image sensing part consists of an effective image sensing region 106 and an optical black region 107 from which light is shielded in order to determine a black reference signal level.

FIGS. 5(a) and 5(b) are sectional views in the horizontal direction of the picture element in the effective image sensing region and the optical black region of a conventional solid-state image sensing device respectively. As a solid-state image pickup device of this kind one may point out the device, for example, disclosed in Technical Digest, pp. 105–108 of the International Electron Devices Meeting, 1992. First, the constitution of a picture element will be described. There is formed a second conductivity type impurity well layer 112, on one surface of a first conductivity type semiconductor substrate 111. A first conductivity type impurity layer 113 constituting a photodiode is formed inside the layer 112, and a second conductivity type impurity layer 114 for suppressing the generation of a dark current is formed on the surface of the layer 112. Further, a first conductivity type impurity layer 115 constituting a vertical CCD register is formed on the surface of the layer 112, and a second conductivity type impurity layer 116 is formed beneath the layer 115. Between the photodiode and the vertical CCD register there is formed a channel stop 118 except for a transfer gate part 117. An insulating film 119 consisting of a silicon dioxide film or a silicon nitride film is formed on the well layer 112 on the surface of the semiconductor substrate 111, and a transfer electrode 120 consisting of a polysilicon film or the like is formed thereon. A metallic wiring 122 consisting of a tungsten film or an aluminum film is formed further on top of an insulating film 121 consisting of a silicon dioxide film or the like, where the metallic wiring 122 is connected to the transfer electrode 120 through a contact hole 123. The metallic wiring 122 is formed so as to cover the vertical CCD register and to have an opening part in the region above the photodiode, and it functions as a bus line for supplying a vertical transfer pulse to the transfer electrode 120 and as a light shielding film for the vertical CCD register. In the picture element of the optical black region (FIG. 5(b)), a light shielding film 125 consisting of an aluminum film or the like is formed further on top of an insulating film 124 consisting of a silicon dioxide film or the like, providing a structure which prevents the incidence of light on the photodiode. Normally, the structures for the picture element of the effective image sensing region and the optical black region are designed to give identical structure and dimension to the photodiode and the CCD register in order to obtain difference only as to the presence or absence of light incidence, so that their constitutions are given a sole difference in whether or not there exists the light shielding film 125.

The pattern for the metallic wirings 122 is determined in consideration of improvement of the sensitivity of the photodiode and reduction of smears, and is normally designed so as to cover well the side faces of the transfer electrode 120. However, at present where the size of each cell is becoming as small as several micrometers, the design margin is such that the metallic wiring projects 0 to 0.3 um or so from the side faces of the transfer electrode 120 in order for the sensitivity of the photodiode to be maintained. Accordingly, the metallic wiring 122 generates a noticeable level difference in the side face parts of the transfer electrode 120 as shown in FIG. 5(b). Due to the misalignment of the mask or the fluctuation in the etching amount there is also a possibility of having a further aggravation in which the step is formed in the shape of an overhang. As a result, in the picture element in the optical black region, there is a problem in that generation of cracks or disconnection at the step part, or excessive reduction, in the thickness of the light shielding film 125, in the side face parts of the metallic wirings, which allows transmission of light and causes variation in the black reference level.

As a method for resolving this problem there may be mentioned the method disclosed in Japanese Laid-Open Patent Application No. Sho 62-145771. This method proposes to prevent the generation of cracks in the light shielding film by completely covering the surface of the photodiode in the optical black region with the transfer electrode to reduce the level difference. This invention makes it possible to prevent leaking-in of light, but it also introduces new problems. Namely, because of the coverage of the entire surface of the photodiode in the optical black region with the transfer electrode, when a nitride film is interposed between the surface of the photodiode and the transfer electrode, the entire surface of the photodiode is covered with the nitride film that does not readily allow hydrogen to pass through, so that the reduction of the dangling bonds by hydrogen annealing which is generally performed at the final stage of the device formation process becomes infeasible. As a result, the photodiode in the optical black region and the photodiode in the effective image sensing region are given mutually different surface conditions, which prevents an exact black reference signal level from being obtained. Moreover, there is generated a problem that the substrate is stressed by the stress in the nitride film, and is made liable to induce faults. This leads to a result that the dark current of the picture element in the optical black region is larger than that of the picture element in the effective image sensing region, preventing the correct black reference level from being obtained.

As another method for preventing transmission of light through the light shielding film, there is a method disclosed in Japanese Laid-Open Patent Application No. Sho 63-266868. This invention proposes to provide a new subsidiary light shielding film between the original light shielding film and the photodiode for the picture element in the optical black region. According to this invention the leaking-in of light can be prevented, but it introduces a problem that the process number is increased and the production cost is raised.

SUMMARY OF THE INVENTION

It is therefore an object of the present invention to provide an improved solid-state image pickup device having the image sensing region and the optical black region.

A solid-state image pickup device according to this invention is characterized in that a metallic wiring for supplying a drive pulse to each transfer electrode of the vertical CCD register is provided on the vertical CCD register, and the spacing between the metallic wirings in the optical black region is narrower than the spacing between the metallic wirings in the effective image sensing region.

The solid-state image pickup device according to this invention is further characterized in that the metallic wirings are formed in the upper parts of the vertical CCD registers in parallel thereto, and the spacing between the metallic wirings in the optical black region is wider than the spacing between the metallic wirings in the effective image sensing region.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1A:
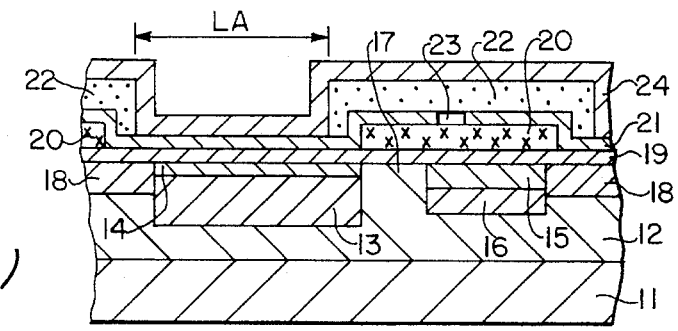
FIG. 1(a) is a sectional view of an image sensing region of a solid-state image pickup device according to one embodiment of this invention.
Figure 1B:
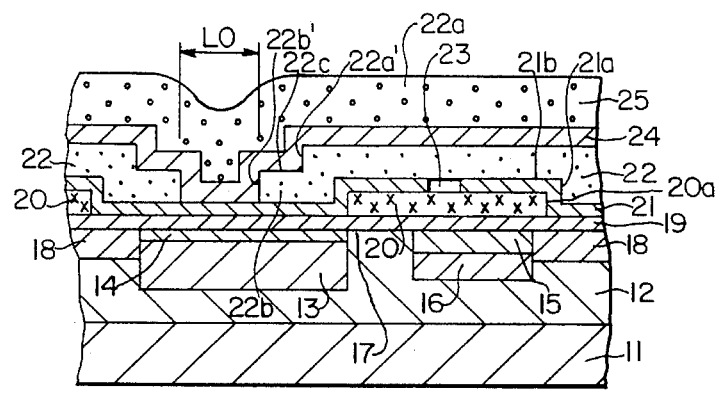
FIG. 1(b) is a sectional view of a optical black region of the solid-state image pickup device according to the embodiment of this invention.

Referring now to FIGS. 1(a) and 1(b), each of an image sensing region and an optical black region has the same construction as each other except wiring and light shielding structures. More specifically, on a major surface of a first conductivity type substrate 11 there is formed a second conductivity type impurity well layer 12. A first conductivity type impurity layer 13 constituting a photodiode is formed inside the well layer 12, and a second conductivity type impurity layer 14 for suppressing the generation of a dark current is formed on the surface of the well layer 12. In addition, a first conductivity type impurity layer 15 constituting a vertical CCD register is formed, and a second conductivity type impurity layer 16 is formed beneath the layer 15. Between the photodiode and the vertical CCD register, a channel stopper 18 is formed except for the transfer gate part 17. An insulating film 19 consisting of a silicon dioxide film or a silicon nitride film is formed on the surface of the impurity layer 12 on one surface of the semiconductor substrate 11, and a transfer electrode 20 consisting of a polysilicon film or the like and having a vertical side surface 20a is formed on top of it. A metallic wiring 22 consisting of a tungsten film or an aluminum film is formed further on top of an insulating film 21 consisting of a silicon dioxide film or the like, where the metallic wiring 22 is connected to the transfer electrode 20 via a contact hole 23. Insulating film 21 includes a vertical side surface 21a and an upper horizontal surface 21b. Here, sometimes the reaction between the metallic wiring 22 and the transfer electrode 20 via the contact hole 23 is prevented by providing a buffer film consisting of a polysilicon film or the like between the metallic wiring 22 and the transfer electrode 20. The metallic wiring 22 is formed so as to cover the vertical CCD register and to form an opening part in the region above the photodiode, and it functions as a bus line for supplying a vertical transfer pulse to the transfer electrode 20 and as a light shielding film for the vertical CCD register. Wiring 22 includes a first portion 22a formed on the vertical side and upper horizontal surfaces 21a, 21b of second insulating film 21 and a second portion 22b extending laterally from first portion 22a toward photodiode 13. Therefore, wiring 22 has a first vertical surface 22a' formed by its first portion 22a, a second vertical surface 22b' formed by its second portion 22b and a horizontal surface 22c of second portion 22b that connects the first and second vertical surfaces 22a', 22b' to each other. First and second vertical surfaces 22a', 22b' and horizontal surface 22c are positioned over photodiode 13. Here, the spacing LO between the metallic wirings of the picture element in the optical black region is formed narrower than the spacing LA between the metallic wirings 22 of the picture element in the effective image sensing region. More specifically, the metallic wiring 22 of the picture element in the optical black region is designed to project out 0.5 to 1.0 μm from the side faces of the transfer electrode.

Note, however, that the spacing LO between the adjacent metallic wirings 22 has to be greater than 0.2 μm because of their required electrical isolation for the purpose of supplying drive pulses with different phases to the wirings 22. In the picture element (FIG. 1(b)) in the optical black region, a light shielding film 25 consisting of an aluminum film or the like is formed further on top of the metallic wiring 22 via an insulating film 24 consisting of a silicon dioxide film or the like. By such a method, it is possible to prevent formation of a large level difference due to the metallic wiring 22 at the edge parts of the photodiode.

Next, referring to the drawings, an example of fabrication of an embodiment of the solid-state image pickup device according to this invention will be described.

Figure 2A:
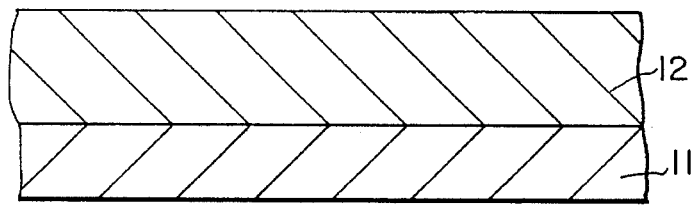
FIGS. 2(a) to 2(d) are sectional views of the optical black region indicative of a fabrication process according to the embodiment of this invention.
Figure 2B:
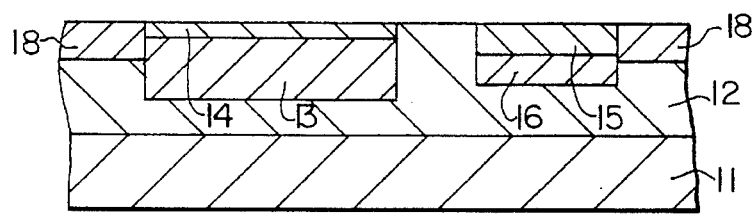
Figure 2C:
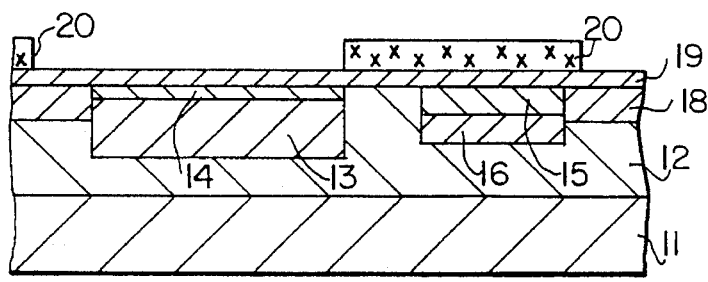
Figure 2D:
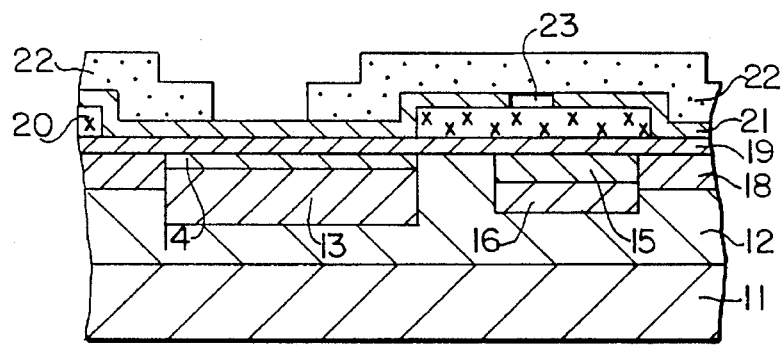
Figure 4:
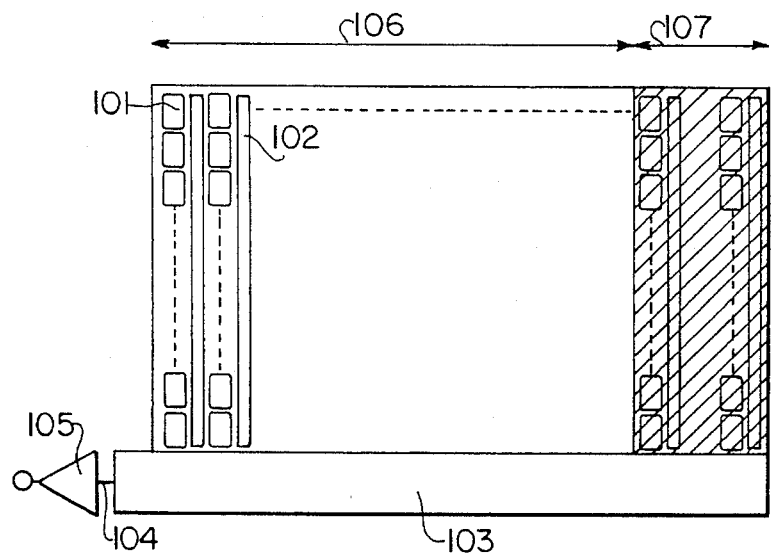
FIG. 4 is a schematic diagram indicative of a general interline CCD type solid-state image pickup device.
Figure 5A:
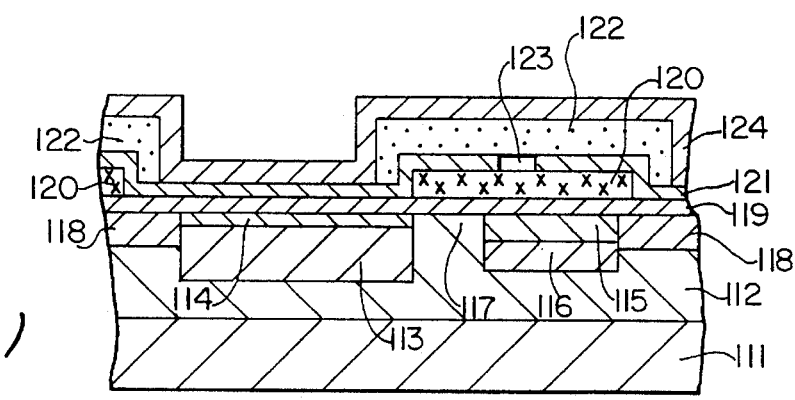
FIG. 5(a) is a sectional view of an effective image sensing region of a solid-state image pickup device according to prior art.
Figure 5B:
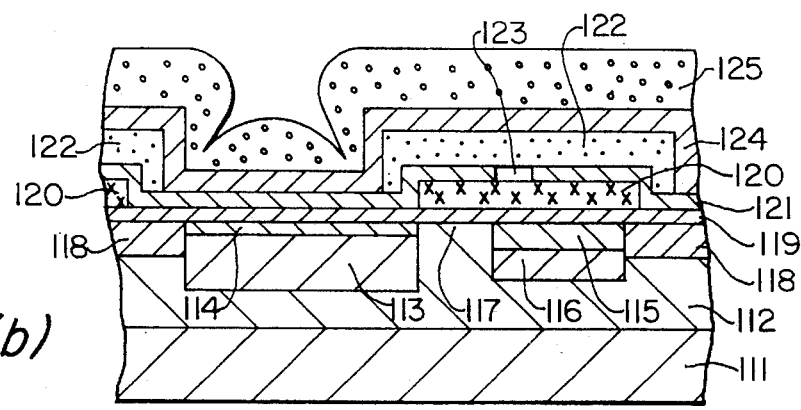
FIG. 5(b) is a sectional view of a optical black region of the solid-state image pickup device according to prior art.

FIG. 2(a) to FIG. 2(d) are sectional views in the horizontal direction, of the picture element in the optical black region for various intermediate stages of the fabrication processes. As shown in FIG. 2(a), on one surface of a first conductivity type semiconductor substrate 11 with concentration of about $10^{14}$ cm$^{-3}$, there is formed by ion implantation the second conductivity type impurity well layer 12 having an impurity concentration of $10^{14}$ to $10^{15}$ cm$^{-3}$. Following that, as shown in FIG. 2(b), the first conductivity type impurity layer 13 having an impurity concentration of $10^{15}$ to $10^{17}$ cm$^{-3}$ is formed by ion implantation on the surface side of the impurity well layer 12 using a resist pattern formed by photolithography as a mask, and the second conductivity type impurity layer 14 having an impurity concentration of $10^{17}$ to $10^{20}$ cm$^{-3}$ is formed again by ion implantation on the surface side of the layer 13. Then, by the same method as that used in the formation of the first conductivity type impurity layer 13, the second conductivity type impurity layer 16 having an impurity concentration of $10^{16}$ to $5\times10^{17}$ cm$^{-3}$, and on its surface side, the first conductivity type impurity layer 15 having an impurity concentration of $10^{16}$ to $5\times10^{17}$ cm$^{-3}$ are formed. Further, the channel stopper 18 having an impurity concentration of $10^{17}$ to $10^{20}$ cm$^{-3}$ is formed. Following that, as shown in FIG. 2(c), the insulating film 19 consisting of a silicon dioxide film or a silicon nitride film is formed on the impurity well layer 12 on the one principal surface of the semiconductor substrate 11. Here, the insulating film 19 may be a multilayered film consisting of a silicon dioxide film and a silicon nitride film. Further, a polysilicon film is formed on the insulating film 19, and the transfer electrode 20 is formed by etching a part of the polysilicon film with dry etching using a resist pattern formed by photolithography as a mask. When a silicon nitride film is used as a component of the insulating film 19, the silicon nitride film is removed simultaneous with the formation of the transfer electrode 20 or in a process following the formation of the transfer electrode 20. Following that, as shown in FIG. 2(d), after formation of the insulating film 21 consisting of a silicon dioxide film, the contact hole 23 is formed in the insulating film 21 above a part of the transfer electrode 20 by dry or wet etching. Further, a metallic film of tungsten or the like or a metallic silicide film such as a tungsten silicide film is deposited by sputtering. Then, the metallic wiring 22 is formed by dry etching using a resist pattern formed by photolithography as a mask. Following that, as shown in FIG. 1(b), after formation of an insulating film consisting of a silicon dioxide film or the like, a metallic film such as an aluminum film is deposited by sputtering or the like method. Then, the light shielding film 25 is formed by dry etching using a resist pattern formed by photolithography as a mask. It should be noted that in FIG. 2(a) to FIG. 2(d) the case has been shown in which the first impurity layer 13 and the second impurity layer 14 are formed in a process preceding the formation of the transfer gate 20, but the order of their formation may be reversed.

Figure 3A:
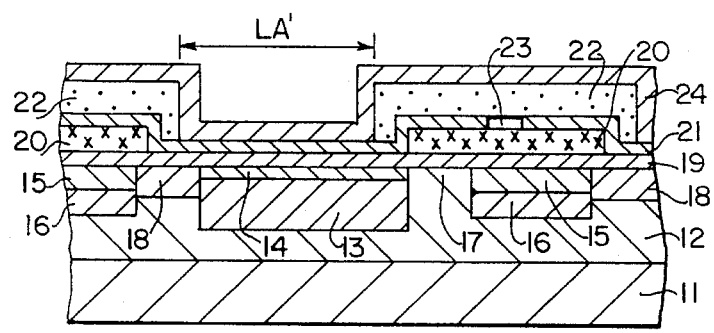
FIG. 3(a) is a sectional view of an effective image sensing region of a solid-state image pickup device according to another embodiment of this invention.
Figure 3B:
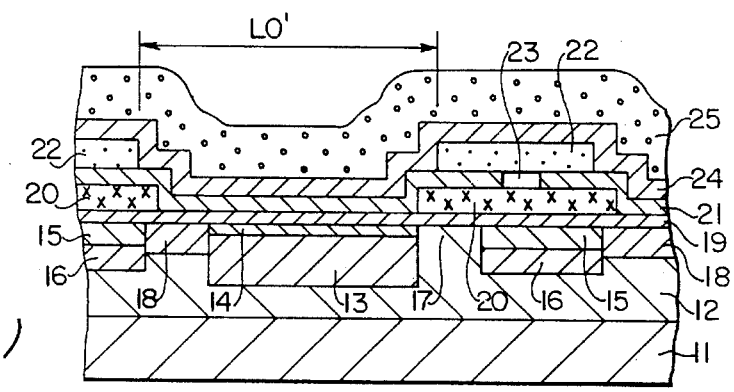
FIG. 3(b) is a sectional view of a optical black region of the solid-state image pickup device according to the embodiment of this invention.

FIG. 3(a) and FIG. 3(b) are sectional views in the horizontal direction, of the picture elements in the effective image sensing region and the optical black region, respectively, of another embodiment of the solid-state image sensing device according to this invention. Although the basic constitution of the picture element in the optical black region is the same as in FIG. 1, the spacing LO' between the metallic wirings 22 of the picture element in the optical black region is formed greater in this embodiment than the spacing LA' between the metallic wirings of the picture element in the effective image sensing region. Specifically, the metallic wiring 22 of the picture element in the optical black region is designed to be indented by 0.2 to 0.5 μm from the side edges of the transfer electrode 20. By means of such a method it is possible to prevent the formation of a large level difference by the metallic wiring 22 at the edges of the photodiode.

In accordance with this invention the shape of the step beneath the light shielding film in the optical black region can be improved and the transmission of light can be prevented. Accordingly, a correct black reference level can be obtained. Moreover, since the nitride film in the upper part of the photodiode is removed, the hydrogen annealing effect can also be obtained in the optical black region, and no difference in the dark current is generated between the effective image sensing region. Further, no addition of an especially new process is required either.

What is claimed is:

1. A solid-state image pickup device having an optical black region, said optical black region comprising:

a semiconductor layer;

a photodiode region selectively formed in said semiconductor layer so that said photodiode region accumulates electric charges;

a CCD register region selectively formed in said semiconductor layer apart from said photodiode region so that a portion of said semiconductor layer separates said CCD register region from said photodiode region;

a first insulating film covering said semiconductor layer;

a transfer electrode formed on said first insulating film to cover said portion of said semiconductor layer and said CCD register region, said transfer electrode having a vertical side surface defining a periphery of said transfer electrode, and wherein said transfer electrode responds to a drive signal applied thereto to transfer electric charges from said photodiode region to said CCD register region;

a second insulating film covering said transfer electrode and said first insulating film, said second insulating film having a contact hole formed therein to expose a part of said transfer electrode and having a vertical side surface corresponding to said vertical side surface of said transfer electrode and an upper horizontal surface;

a wiring layer formed on said second insulating film, said wiring layer being in contact with said part of said transfer electrode through said contact hole so that a drive signal can be applied to said transfer electrode, said wiring layer including a first portion formed on said vertical side and upper horizontal surfaces of said second insulating film and a second portion extending laterally from said first portion toward said photodiode region, so that said wiring region has a first vertical surface formed by said first portion, a second vertical surface formed by said second portion and a horizontal surface formed by said second portion to connect said first and second vertical surfaces to each other, each of said first and second vertical surfaces and said horizontal surface being positioned over said photodiode region;

a third insulating film covering said wiring layer and said second insulating film; and a light shielding film formed on said third insulating film to cover said photodiode region, said CCD register region and said portion of said semiconductor layer.

2. The device of claim 1, wherein said wiring layer and said light shielding film are each composed of a metal.

3. A solid-state image pickup device having an optical black region, said optical black region comprising:

a semiconductor layer;

a photodiode region selectively formed in said semiconductor layer so that said photodiode region accumulates electric charges;

a CCD register region selectively formed in said semiconductor layer apart from said photodiode region so that a portion of said semiconductor layer separates said CCD register region from said photodiode region;

a first insulating film covering said semiconductor layer;

a transfer electrode formed on said first insulating film to cover said portion of said semiconductor layer and said CCD register region so that said transfer electrode has a vertical side surface defining a periphery of said transfer electrode, and wherein said transfer electrode responds to a drive signal applied thereto to transfer electric charges from said photodiode region to said CCD register region;

a second insulating film covering said transfer electrode and said first insulating film, said second insulating film having a contact hole formed therein to expose a part of said transfer electrode;

a wiring layer formed on said second insulating film, said wiring layer being in contact with said part of said transfer electrode through said contact hole, said wiring layer having a vertical side surface defining a periphery of said wiring layer and being indented from said vertical side surface of said transfer electrode toward said CCD register region;

a third insulating film covering said wiring layer and said second insulating film; and a light shielding film formed on said third insulating film to cover said photodiode region, said CCD region and said portion of said semiconductor layer.

4. The device of claim 3, wherein said wiring layer and said light shielding film are each made of a metal.

5. A solid-state image pickup device comprising:

a semiconductor layer;

an effective image sensing region including:
 (a) a first photodiode region selectively formed in said semiconductor layer;
 (b) a first CCD register region selectively formed in said semiconductor layer apart from said first photodiode region so that a first portion of said semiconductor layer separates said first CCD register region from said first photodiode region;
 (c) a first insulating film covering said first photodiode region, said first portion of said semiconductor layer and said first CCD register region;
 (d) a first transfer electrode formed on said first insulating film to cover said first portion of said semiconductor layer and said first CCD register region;
 (e) a second insulating film covering said transfer electrode and said first insulating film, said second insulating film having a first contact hole formed therein to expose a part of said first transfer electrode; and
 (f) a first wiring layer formed on said second insulating film, said first wiring layer being in contact with said part of said first transfer electrode through said first contact hole and said first wiring layer having an opening formed therein to expose a part of said second insulating film above said first photodiode region; and an optical black region, said optical black region including:
 (a) a second photodiode region selectively formed in said semiconductor layer;
 (b) a second CCD register region selectively formed in said semiconductor layer apart from said second photodiode region so that a second portion of said semiconductor layer separates said second photodiode region and said second CCD register region;
 (c) a fourth insulating film covering said second photodiode region, said second portion of said semiconductor layer and said second CCD register region;
 (d) a second transfer electrode formed on said fourth insulating film to cover said second portion of said semiconductor layer and said second CCD register region;
 (e) a fifth insulating film covering said second transfer electrode and said fourth insulating film, said fifth insulating film having a second contact hole formed therein to expose a part of said second transfer electrode;
 (f) a second wiring layer formed on said fifth insulating film, said second wiring layer being in contact with said part of said second transfer electrode through said second contact hole, and said second wiring layer having an opening formed therein to expose a part of said fifth insulating film above said second photodiode region, said opening in said second wiring layer being different in size from said opening in said first wiring layer to prevent transmission of light; and
 (g) a light shielding film formed to cover said effective image sensing region and said optical black region, wherein said light shielding film does not cover said first photodiode region of said effective image sensing region.

6. The device of claim 5, wherein said opening in said second wiring layer is smaller than said opening in said first wiring layer.

7. The device of claim 5, wherein said opening in said second wiring layer is larger than said opening in said first wiring layer.

* * * * *